US012564010B2

(12) United States Patent (10) Patent No.: US 12,564,010 B2

Yu (45) Date of Patent: Feb. 24, 2026

(54) CHUCK WITH NON-FLAT SHAPED SURFACE

(71) Applicant: Intel NDTM US LLC, Santa Clara, CA (US)

(72) Inventor: Hongpeng Yu, Liaoning (CN)

(73) Assignee: Intel NDTM US LLC, Santa Clara, CA (US)

( * ) Notice: Subject to any disclaimer, the term of this patent is extended or adjusted under 35 U.S.C. 154(b) by 953 days.

(21) Appl. No.: 17/544,072

(22) Filed: Dec. 7, 2021

(65) Prior Publication Data

US 2023/0163011 A1 May 25, 2023

Related U.S. Application Data

(63) Continuation of application No. PCT/CN2021/132253, filed on Nov. 23, 2021.

(51) Int. Cl.
*H01L 21/687* (2006.01)
*H01L 21/683* (2006.01)

(52) U.S. Cl.
CPC .... *H01L 21/68735* (2013.01); *H01L 21/6833* (2013.01); *H01L 21/6838* (2013.01); *H01L 21/68785* (2013.01)

(58) Field of Classification Search
CPC ............. H01L 21/6833; H01L 21/6838; H01L 21/68735; H01L 21/68785
See application file for complete search history.

(56) References Cited

U.S. PATENT DOCUMENTS

| | | | |
|---|---|---|---|
| 6,168,504 B1 * | 1/2001 | Gotcher, Jr. ............ | B24B 37/30 |
| | | | 451/286 |
| 9,539,800 B2 * | 1/2017 | Kito ..................... | H01L 21/2007 |
| 10,629,416 B2 * | 4/2020 | Kogler .............. | H01J 37/32697 |
| 10,964,560 B2 * | 3/2021 | Choi ................... | H01L 21/6875 |
| 11,012,008 B2 * | 5/2021 | Maeta .............. | H01L 21/68735 |

FOREIGN PATENT DOCUMENTS

| | | | | | |
|---|---|---|---|---|---|
| CN | 113594016 A | * | 11/2021 | .............. | F28F 27/00 |
| JP | H05206253 A | * | 8/1993 | ....... | H01L 21/68735 |
| JP | 6702526 B1 | * | 6/2020 | .............. | B23Q 3/15 |
| JP | 2020205349 A | * | 12/2020 | | |
| WO | WO-2007013619 A1 | * | 2/2007 | ........... | H01L 21/683 |

* cited by examiner

*Primary Examiner* — Eric A. Gates

(74) *Attorney, Agent, or Firm* — Morgan, Lewis & Bockius LLP

(57) ABSTRACT

An embodiment of an apparatus may include a chuck body, and a surface formed on the chuck body to hold a wafer, where the surface has a non-flat shape. Other embodiments are disclosed and claimed.

19 Claims, 6 Drawing Sheets

80

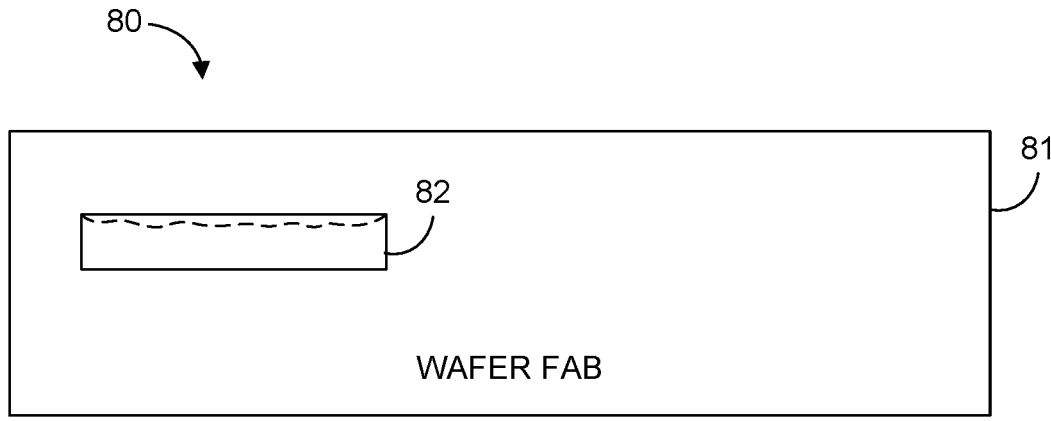

81

82

WAFER FAB

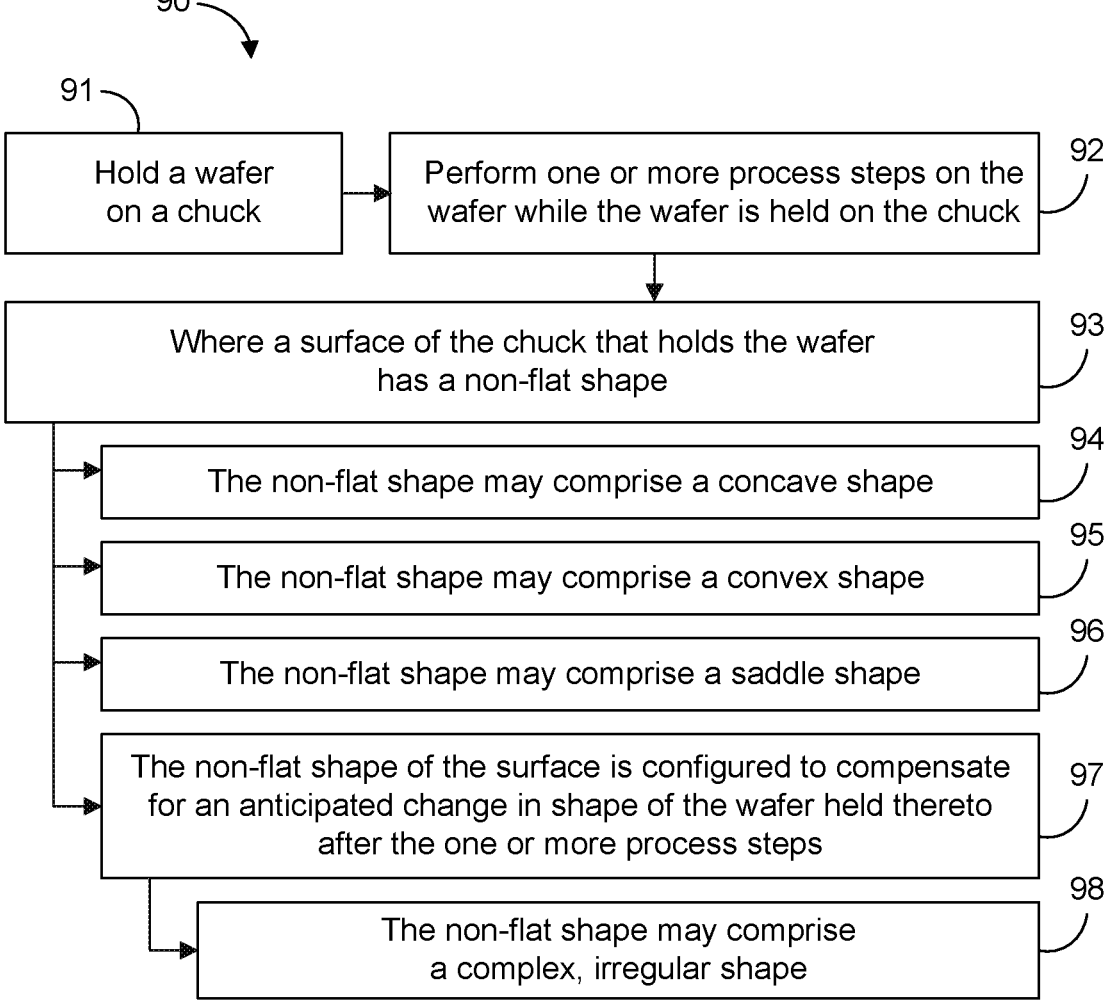

| Hold a wafer on a chuck | Perform one or more process steps on the wafer while the wafer is held on the chuck | 92 |

Where a surface of the chuck that holds the wafer has a non-flat shape — 93

The non-flat shape may comprise a concave shape — 94

The non-flat shape may comprise a convex shape — 95

The non-flat shape may comprise a saddle shape — 96

The non-flat shape of the surface is configured to compensate for an anticipated change in shape of the wafer held thereto after the one or more process steps — 97

The non-flat shape may comprise a complex, irregular shape — 98

FIG. 9

CHUCK WITH NON-FLAT SHAPED SURFACE

CLAIM FOR PRIORITY

This application claims priority to International Patent Application No. PCT/CN2021/132253, filed Nov. 23, 2021 and titled "CHUCK WITH NON-FLAT SHAPED SURFACE," which is incorporated by references in its entirety for all purposes.

BACKGROUND

The shape of a silicon wafer has a significant impact on various fabrication processes and product yield. Ideally the wafer is a perfectly flat, round disk of uniform thickness. In practice, however, the wafer deviates from perfectly flat to some extent due to deformations, thickness variations, and stress from various processes.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 8 is a block diagram of an of example of a system according to an embodiment;

FIG. 9 is an illustrative diagram of an example of a method according to an embodiment.

DETAILED DESCRIPTION

Figure 1A:
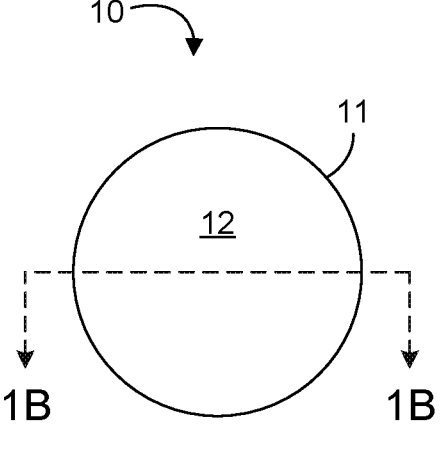
FIG. 1A is an illustrative top view of an example of a chuck according to an embodiment.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-boned interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The meaning of "a," "an," and "the" include plural references. The meaning of "in" includes "in" and "on." The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Wafer flatness may refer to a variation of a wafer surface relative to a reference plane. An example reference plane may be selected with any suitable technique. Depending on a measured parameter, an example reference plane may be designated by three points at specified locations on a front surface of the wafer, a least square fit to the front surface, a least square fit to the median surface (e.g., a middle of the wafer), a least square fit to a back surface of the wafer, a straight back surface (e.g., where the wafer is positioned against a flat chuck), etc. Deviations from ideal flatness may be referred to as total thickness variation (TTV), bow, and warp, along with other shape parameters. Such deviations in wafer shape may affect the capability of various device processing steps, including etching, bonding, lithography, etc. For example, TTV has a direct effect on the thickness of the membrane obtained by through-wafer wet etching, and accordingly may have a significant influence on the properties of the resulting device. Bow and warp may be exacerbated during wafer processing due to additional residual stresses.

Some embodiments provide technology for a chuck design that improves wafer surface flatness across the wafer. In 3D NAND technology, for example, a film stack gets thicker and thicker with more tiers and such thicker stacks make the process more difficult due to wafer stress, topography, shape control, etc. For example, some high bow or saddle-shaped wafers may not be able to be processed downstream because conventional hardware is not designed to handle such high bow or uneven shapes (e.g., when the deviation exceeds the tolerance of such equipment). Such high wafer stress and/or distorted shapes may be a result of upstream processes, such as thick film deposition or high aspect ratio patterning processes.

Some conventional approaches to handling a high bow wafer shape include using other films to compensate for the high bow. For example, if a wafer shape is too negative, a downstream process deposits a compressive film at the wafer backside to make the wafer shape more towards the positive side. One problem with this approach is that the additional film is only effective to compensate for a uniform wafer shape change, and cannot handle other distorted shapes such as a saddle shape. Another problem is that depositing a very thick film at the wafer backside incurs extra costs. Such backside film deposition may cause other issues, such as a chucking problem, in further downstream processes. If another downstream process is used to remove the backside film, additional costs are generated. Some embodiments may overcome one or more of the foregoing problems.

Some embodiments provide a non-flat, shaped chuck to hold a wafer for one or more process steps, where the chuck is shaped to compensate for an anticipated stress/shape change generated from the one or more process steps. After the wafer is released from the non-flat, shaped check, the wafer may achieve a better across-wafer shape. Advantageously, embodiments may help to provide a flatter wafer shape as compared to a flat chuck for the same one or more process steps, which may be particularly beneficial for thicker integrated circuit devices such as 3D NAND memory devices. Embodiments may also advantageously simplify a process flow and reduce cost (e.g., by reducing or avoiding the need for additional films and/or process steps).

In conventional semiconductor equipment, a wafer is held in a flat chuck during the fabrication process. The chuck may utilize an electrostatic charge (ESC) or a vacuum to hold the wafer in close contact with the chuck. If the process generates high stress, such as a thick film deposition process or very thick film high aspect ratio patterning process, the wafer shape may be changed to exhibit a non-flat shape (e.g., concave shape, convex shape, saddle shape, other more complex shape). Such non-flat wafer shape is generally not desired in a process flow because the irregular wafer may cause downstream process difficulty.

Figure 1B:
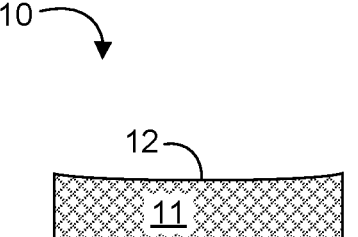
FIG. 1B is a side, cross sectional view taken along 1B-1B in FIG. 1A.

With reference to FIGS. 1A to 1B, an embodiment of a chuck 10 has a round, cylindrical body 11 with a concave mount surface 12 to hold a wafer. Other practical features of the chuck 10 are omitted for clarity (e.g., structures for the semiconductor process equipment to secure the chuck 10 thereto; wafer holding feature such as ESC, vacuum holes, etc.; etc.). The chuck 10 is specially designed to be utilized for a particular one or more process steps that are known to impart an undesirable change in a shape of the wafer. The precise amount of the curve of the concave mount surface 12 is formed to compensate for the anticipated change in the wafer shape, such that the resulting wafer shape, after being held in the non-flat, shaped chuck 10 and going through the one or more process steps, is substantially flat or flat enough to reduce or avoid downstream process difficulties.

Figure 2A:
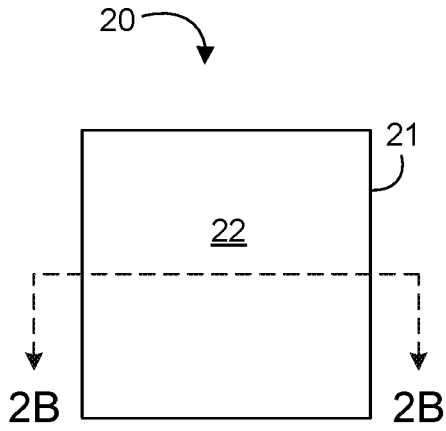
FIG. 2A is an illustrative top view of another example of a chuck according to an embodiment.
Figure 2B:
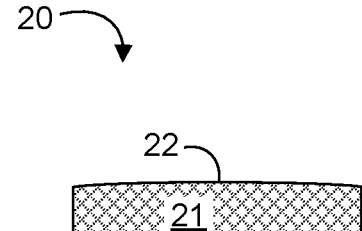
FIG. 2B is a side, cross sectional view taken along 2B-2B in FIG. 2A.

FIGS. 2A to 2B show an embodiment of a chuck 20 with a square shape for the body 21 of the chuck 20 and a convex mount surface 22. Other practical features of the chuck 20 are omitted for clarity (e.g., structures for the semiconductor process equipment to secure the chuck 20 thereto; wafer holding feature such as ESC, vacuum holes, etc.; etc.). The chuck 20 is specially designed to be utilized for a particular one or more process steps that are known to impart an undesirable change in a shape of the wafer. The precise amount of the curve of the convex mount surface 22 is formed to compensate for the anticipated change in the wafer shape, such that the resulting wafer shape, after being held in the non-flat, shaped chuck 20 and going through the one or more process steps, is substantially flat or flat enough to reduce or avoid downstream process difficulties.

Figure 3A:
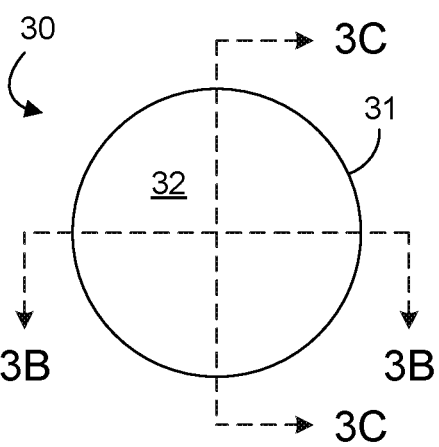
FIG. 3A is an illustrative top view of another example of a chuck according to an embodiment.
Figure 3C:
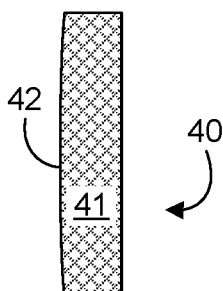
FIG. 3C is a side, cross sectional view taken along 3C-3C in FIG. 3A.
Figure 3B:
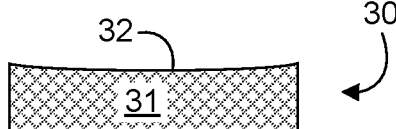
FIG. 3B is a side, cross sectional view taken along 3B-3B in FIG. 3A.

FIGS. 3A to 3C show an embodiment of a chuck 30 with a round shape for the body 31 of the chuck 30 and a saddle-shape mount surface 32. Other practical features of the chuck 30 are omitted for clarity (e.g., structures for the semiconductor process equipment to secure the chuck 30 thereto; wafer holding feature such as ESC, vacuum holes, etc.; etc.). The chuck 30 is specially designed to be utilized for a particular one or more process steps that are known to impart an undesirable change in a shape of the wafer. The precise configuration of the convex and concave contours of the saddle-shape mount surface 32 are formed to compensate for the anticipated change in the wafer shape, such that the resulting wafer shape, after being held in the non-flat, shaped chuck 30 and going through the one or more process steps, is substantially flat or flat enough to reduce or avoid downstream process difficulties.

Figure 4A:
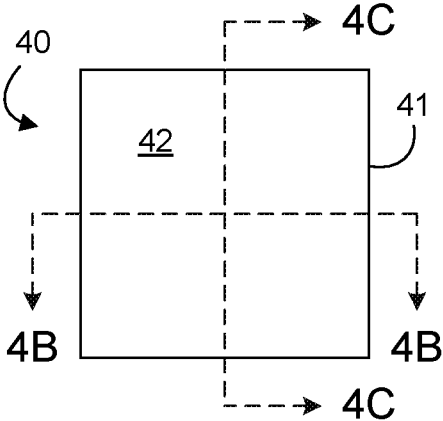
FIG. 4A is an illustrative top view of another example of a chuck according to an embodiment.
Figure 4C:
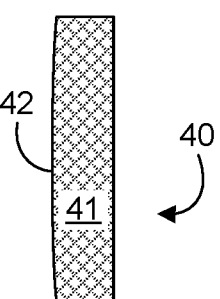
FIG. 4C is a side, cross sectional view taken along 4C-4C in FIG. 4A.
Figure 4B:
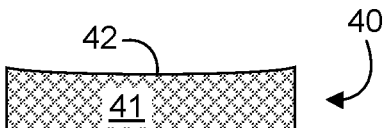
FIG. 4B is a side, cross sectional view taken along 4B-4B in FIG. 4A.

FIGS. 4A to 4C show an embodiment of a chuck 40 with a square shape for the body 41 of the chuck 40 and a saddle-shape mount surface 42. Other practical features of the chuck 40 are omitted for clarity (e.g., structures for the semiconductor process equipment to secure the chuck 40 thereto; wafer holding feature such as ESC, vacuum holes, etc.; etc.). The chuck 40 is specially designed to be utilized for a particular one or more process steps that are known to impart an undesirable change in a shape of the wafer. The precise configuration of the convex and concave contours of the saddle-shape mount surface 42 are formed to compensate for the anticipated change in the wafer shape, such that the resulting wafer shape, after being held in the non-flat, shaped chuck 40 and going through the one or more process steps, is substantially flat or flat enough to reduce or avoid downstream process difficulties.

Figure 5A:
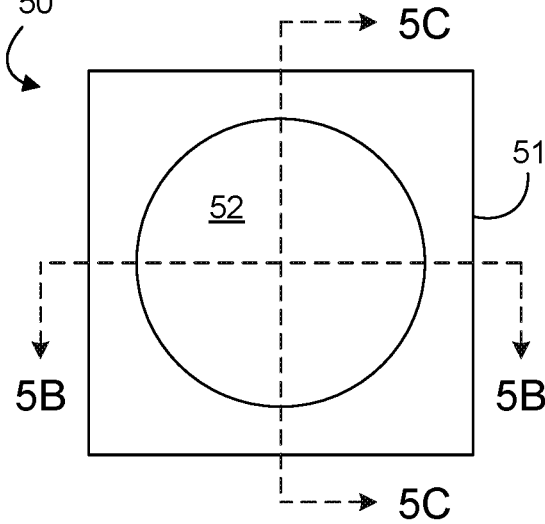
FIG. 5A is an illustrative top view of another example of a chuck according to an embodiment.
Figure 5C:
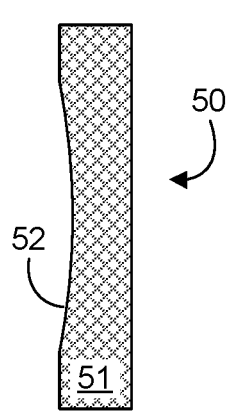
FIG. 5C is a side, cross sectional view taken along 5C-5C in FIG. 5A.
Figure 5B:
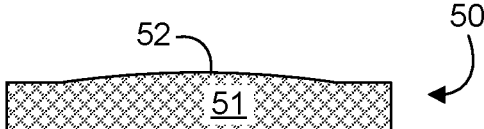
FIG. 5B is a side, cross sectional view taken along 5B-5B in FIG. 5A.

FIGS. 5A to 5C show an embodiment of a chuck 50 with a square outer shape for the body 51 of the chuck 50 with a round inner shape for a saddle-shape mount surface 52. Other practical features of the chuck 50 are omitted for clarity (e.g., structures for the semiconductor process equipment to secure the chuck 50 thereto; wafer holding feature such as ESC, vacuum holes, etc.; etc.). The chuck 50 is specially designed to be utilized for a particular one or more process steps that are known to impart an undesirable change in a shape of the wafer. The precise configuration of the convex and concave contours of the saddle-shape mount surface 52 are formed to compensate for the anticipated change in the wafer shape, such that the resulting wafer shape, after being held in the non-flat, shaped chuck 50 and going through the one or more process steps, is substantially flat or flat enough to reduce or avoid downstream process difficulties.

A chuck in accordance with embodiments may have any useful shape for the chuck body. The non-flat, shaped wafer mount surface may also have a variety of shapes selected to compensate for anticipated changes in the wafer shape. Those skilled in the art will appreciate that the drawings are not necessarily to scale and that the amount of curvature shown for the various mount surfaces may be exaggerated for the purpose of illustration. In particular, embodiments of a chuck may include a mount surface that is more complicated and does not conform to any uniform curves or contours. Any suitable technology may be utilized to form an embodiment of a chuck with a non-flat mount surface. Although the chuck may be manually machined, embodiments may more preferably be formed more precisely utilizing automated equipment.

In some embodiments, a wafer shape may be characterized by a set of data points. Any suitable technology and/or techniques may be utilized to characterize the wafer shape. Example tools to measure wafer flatness include metrology equipment, laser interferometers, laser displacement sensors, and non-contact capacitive sensors. Such tools may precisely measure wafer flatness, bow, warp, total thickness variation (TTV), residual stress, etc. A measured thickness may indicate the distance through a wafer between corresponding X, Y points on a front and back surface, and may be calculated to a precise resolution and repeatability (e.g., on the order of ten millionths of an inch). A measured bow may indicate the deviation of the center point of the median surface of a free, unclamped wafer from the median surface reference plane (e.g., established by three or more points at equidistant locations on the wafer). A measured warp may indicate the differences between the maximum and minimum distances of the median surface of a free, unclamped wafer from a reference plane.

For non-capacitive sensing, for example, capacitance probes use low voltage electric fields to measure the distance from the probe to the wafer. The wafer is located between two probes and the distance between the two probes is accurately known. The gap between the wafer and the probes is determined from the capacitance at each measurement point. Automated equipment using such tools may generate thousands of such measured data points that accurately characterize the wafer shape and that may be output in a computer readable format.

Embodiments of a chuck may include a mount surface that considers both a starting wafer shape and a process impact to generate the chuck design. Starting with a characterized wafer shape (e.g., either a known incoming wafer shape prior to a process or a known resulting wafer shape after the process with a flat chuck), embodiments may utilize the data points from the characterized wafer shape to configure a mount surface for a chuck that precisely compensates for the known or anticipated impact of the process at each data point to provide a substantially flat wafer after the process.

In some embodiments, a data point from the characterized shape with a planar location (X, Y) and a deviation (D) relative to a reference plane may be read into a computer and transformed to a corresponding data point for the non-flat mount surface of the chuck with the same planar location (X, Y) and a compensation amount (–D) relative to the reference plane. In some embodiments, the compensation amount may be weighted (e.g., compensation amount=–D*W) based on known stresses of the process. In some embodiments, such weighting may be variable based on the planar location (e.g., compensation amount=–D*W[X, Y]) based on known variable stresses of the process at different planar locations of the process.

Embodiments may transform hundreds or thousands of data points from the characterized shape to generate a full set of transformed data points. The full set of transformed data points may define a suitable surface for the chuck to compensate for the anticipated change of shape of the wafer from the process. Forming the chuck with the defined surface may be performed utilizing any suitable technology. For example, automated machinery may utilize the full set of transformed data points to machine the defined surface into a block of metal to form the chuck with the non-flat surface. In another example, computer-aided design (CAD) and/or computer-aided manufacturing (CAM) software may input the full set of transformed data points to generate a three-dimensional (3D) model for the chuck. Automated equipment may be utilized to form the chuck with the non-flat surface from the 3D model. For example, a 3D printer may be utilized to print the chuck with the non-flat surface from the 3D model. Alternatively, the transformed data points may be utilized to create a mold for the chuck with the non-flat surface, and the mold may be used to form the chuck with the non-flat surface.

Figure 6:
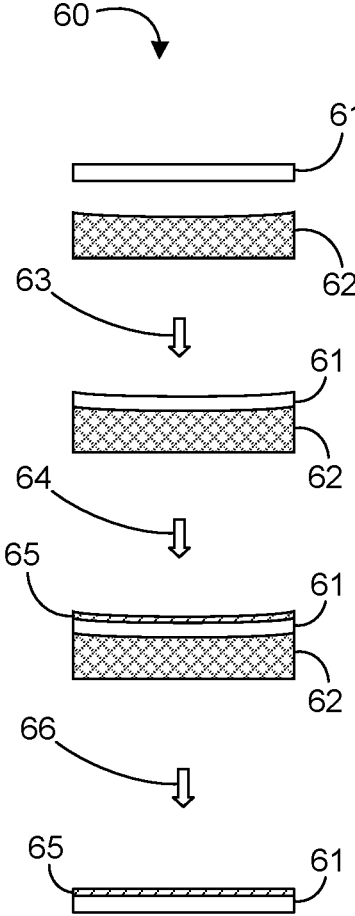
FIG. 6 is an illustrative diagram of an example of process according to an embodiment.

With reference to FIG. 6, an embodiment of a process 60 starts with a wafer 61. The incoming wafer shape is known and the kind of stress the wafer shape will generate during the process 60 is also known. The process 60 then includes utilizing a specially designed chuck 62 with curved surface that is configured to compensate for the known incoming wafer shape and the known stress. At arrow 63, the process 60 includes securing the wafer 61 to the chuck 62 and the chuck 62 holds the wafer 61 closely in contact with the chuck 62 (e.g., with an ESC or vacuum function). As shown in FIG. 6, the wafer 61 conforms to and follows the curvature of the chuck 62. At arrow 64, the process 60 includes adding or removing material 65 to/from the wafer 61. Next, at arrow 66, the wafer 61 is released from the chuck 62 and the processed wafer 61 (e.g., with the added/removed material 65) has a substantially flat profile (e.g., a flatter profile as compared to similar processing with a conventional flat chuck).

While the example illustrated in FIG. 6 compensates for a positive bow imparted by the process 60 on the wafer 61, other embodiments may compensate for other deviations in the wafer shape. For example, if a process generates compressive stress in the film, a wafer may have a negative bow after the process. To compensate such compressive stress, embodiments may utilize a chuck designed with a positive curve in the top surface. When a wafer is held on the chuck with the positive surface and goes through the process with the compressive stress, the overall result is a flat surface for the wafer (e.g., a flatter profile as compared to similar processing with a conventional flat chuck).

Figure 7:
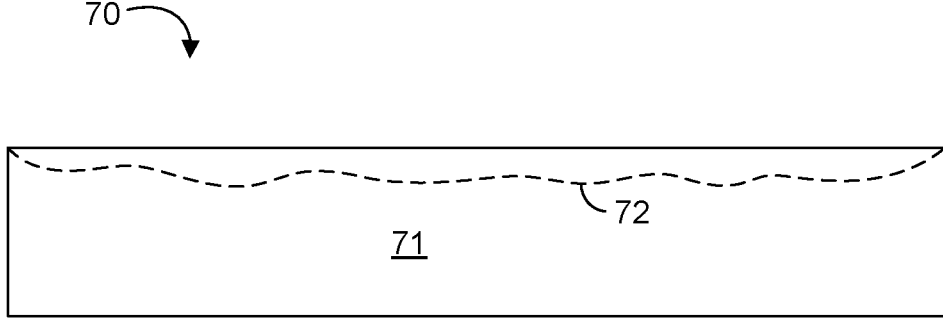
FIG. 7 is a block diagram of an example of an apparatus according to an embodiment.

With reference to FIG. 7, an embodiment of a chuck 70 includes a chuck body 71 and a surface 72 formed on the chuck body 71 to hold a wafer, where the surface 72 has a non-flat shape. For example, the non-flat shape may include a concave shape, a convex shape, a saddle shape, etc. In some embodiments, as described in more detail above, the non-flat shape of the surface 72 is configured to compensate for an anticipated change in shape of a wafer to be held thereon after one or more process steps. For example, the non-flat shape may have a complex, irregular shape.

With reference to FIG. 8, an embodiment of a system 80 includes a wafer fabrication apparatus 81 to perform one or more process steps on a wafer, and a chuck 82 coupled to the wafer fabrication apparatus 81 to hold the wafer for the one or more process steps, where a surface of the chuck 82 that holds the wafer has a non-flat shape. For example, the non-flat shape may include a concave shape, a convex shape, a saddle shape, etc. In some embodiments, as described in more detail above, the non-flat shape of the surface is configured to compensate for an anticipated change in shape of a wafer to be held thereon after the one or more process steps. For example, the non-flat shape may have a complex, irregular shape.

With reference to FIG. 9, an embodiment of a method 90 may include holding a wafer on a chuck at box 91, and performing one or more process steps on the wafer while the wafer is held on the chuck at box 92, where a surface of the chuck that holds the wafer has a non-flat shape at box 93. For example, the non-flat shape may comprise a concave shape at box 94, the non-flat shape may comprise a convex shape at box 95, and/or the non-flat shape may comprise a saddle shape at box 96. In some embodiments of the method 90, the non-flat shape of the surface is configured to compensate for an anticipated change in shape of the wafer held thereto after the one or more process steps at box 97. For example, the non-flat shape may comprise a complex, irregular shape at box 98.

Figure 10:
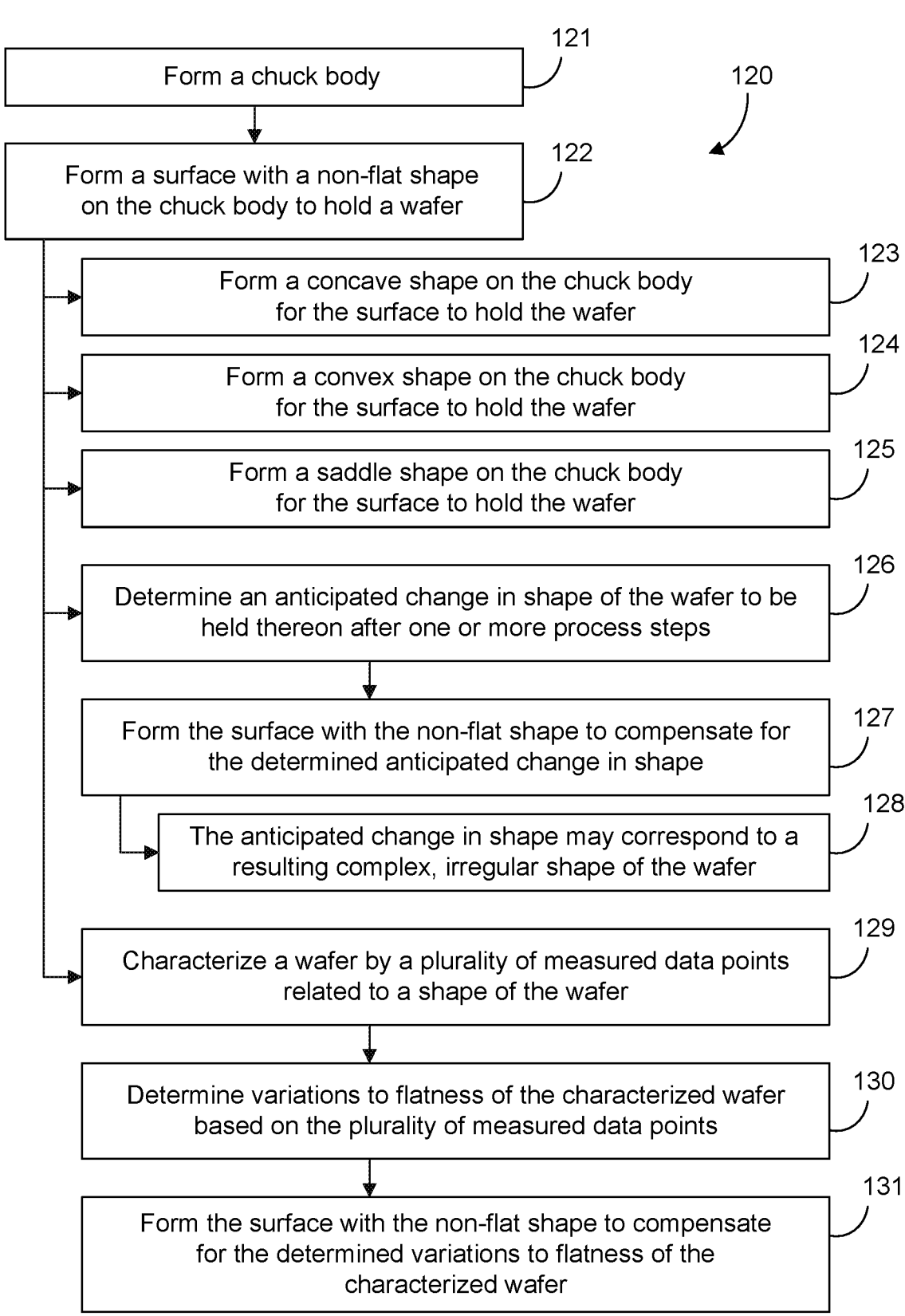
FIG. 10 is an illustrative diagram of another example of a method according to an embodiment.

With reference to FIG. 10, an embodiment of a method 120 includes forming a chuck body at box 121, and forming a surface with a non-flat shape on the chuck body to hold a wafer at box 122. For example, the method 120 may include forming a concave shape on the chuck body for the surface to hold the wafer at box 123, forming a convex shape on the chuck body for the surface to hold the wafer at box 124, and/or forming a saddle shape on the chuck body for the surface to hold the wafer at box 125.

Some embodiments of the method 120 may include determining an anticipated change in shape of the wafer to be held thereon after one or more process steps at box 126, and forming the surface with the non-flat shape to compensate for the determined anticipated change in shape at box 127. For example, the anticipated change in shape may correspond to a resulting complex, irregular shape of the wafer at box 128. Some embodiments of the method 120 may further include characterizing a wafer by a plurality of measured data points related to a shape of the wafer at box 129, determining variations to flatness of the characterized wafer based on the plurality of measured data points at box 130, and forming the surface with the non-flat shape to compensate for the determined variations to flatness of the characterized wafer at box 131.

ADDITIONAL NOTES AND EXAMPLES

Example 1 includes an apparatus, comprising a chuck body, and a surface formed on the chuck body to hold a wafer, wherein the surface has a non-flat shape.

Example 2 includes the apparatus of Example 1, wherein the non-flat shape comprises a concave shape.

Example 3 includes the apparatus of any of Examples 1 to 2, wherein the non-flat shape comprises a convex shape.

Example 4 includes the apparatus of any of Examples 1 to 3, wherein the non-flat shape comprises a saddle shape.

Example 5 includes the apparatus of any of Examples 1 to 4, wherein the non-flat shape of the surface is configured to compensate for an anticipated change in shape of a wafer to be held thereon after one or more process steps.

Example 6 includes the apparatus of Example 5, wherein the non-flat shape comprises a complex, irregular shape.

Example 7 includes a system, comprising a wafer fabrication apparatus to perform one or more process steps on a wafer, and a chuck coupled to the wafer fabrication apparatus to hold the wafer for the one or more process steps, wherein a surface of the chuck that holds the wafer has a non-flat shape.

Example 8 includes the system of Example 7, wherein the non-flat shape comprises a concave shape.

Example 9 includes the system of any of Examples 7 to 8, wherein the non-flat shape comprises a convex shape.

Example 10 includes the system of any of Examples 7 to 9, wherein the non-flat shape comprises a saddle shape.

Example 11 includes the system of any of Examples 7 to 10, wherein the non-flat shape of the surface is configured to compensate for an anticipated change in shape of a wafer to be held thereon after the one or more process steps.

Example 12 includes the system of Example 11, wherein the non-flat shape comprises a complex, irregular shape.

Example 13 includes a method, comprising holding a wafer on a chuck, and performing one or more process steps on the wafer while the wafer is held on the chuck, wherein a surface of the chuck that holds the wafer has a non-flat shape.

Example 14 includes the method of Example 13, wherein the non-flat shape comprises a concave shape.

Example 15 includes the method of any of Examples 13 to 14, wherein the non-flat shape comprises a convex shape.

Example 16 includes the method of any of Examples 13 to 15, wherein the non-flat shape comprises a saddle shape.

Example 17 includes the method of any of Examples 13 to 16, wherein the non-flat shape of the surface is configured to compensate for an anticipated change in shape of the wafer held thereto after the one or more process steps.

Example 18 includes the method of Example 17, wherein the non-flat shape comprises a complex, irregular shape.

Example 19 includes a method, comprising forming a chuck body, and forming a surface with a non-flat shape on the chuck body to hold a wafer.

Example 20 includes the method of Example 19, further comprising forming a concave shape on the chuck body for the surface to hold the wafer.

Example 21 includes the method of any of Examples 19 to 20, further comprising forming a convex shape on the chuck body for the surface to hold the wafer.

Example 22 includes the method of any of Examples 19 to 21, further comprising forming a saddle shape on the chuck body for the surface to hold the wafer.

Example 23 includes the method of any of Examples 19 to 22, further comprising determining an anticipated change in shape of the wafer to be held thereon after one or more process steps, and forming the surface with the non-flat shape to compensate for the determined anticipated change in shape.

Example 24 includes the method of Example 23, wherein the anticipated change in shape corresponds to a resulting complex, irregular shape of the wafer.

Example 25 includes the method of any of Examples 19 to 24, further comprising characterizing a wafer by a plurality of measured data points related to a shape of the wafer, determining variations to flatness of the characterized wafer based on the plurality of measured data points, and forming the surface with the non-flat shape to compensate for the determined variations to flatness of the characterized wafer.

Example 26 includes an apparatus, comprising means for holding a wafer on a chuck, and means for performing one or more process steps on the wafer while the wafer is held on the chuck, wherein a surface of the chuck that holds the wafer has a non-flat shape.

Example 27 includes the apparatus of Example 26, wherein the non-flat shape comprises a concave shape.

Example 28 includes the apparatus of any of Examples 26 to 28, wherein the non-flat shape comprises a convex shape.

Example 29 includes the apparatus of any of Examples 26 to 28, wherein the non-flat shape comprises a saddle shape.

Example 30 includes the apparatus of any of Examples 26 to 29, wherein the non-flat shape of the surface is configured to compensate for an anticipated change in shape of the wafer held thereto after the one or more process steps.

Example 31 includes the apparatus of Example 30, wherein the non-flat shape comprises a complex, irregular shape.

Example 32 includes an apparatus, comprising means for forming a chuck body, and means for forming a surface with a non-flat shape on the chuck body to hold a wafer.

Example 33 includes the apparatus of Example 32, further comprising means for forming a concave shape on the chuck body for the surface to hold the wafer.

Example 34 includes the apparatus of any of Examples 32 to 33, further comprising means for forming a convex shape on the chuck body for the surface to hold the wafer.

Example 35 includes the apparatus of any of Examples 32 to 34, further comprising means for forming a saddle shape on the chuck body for the surface to hold the wafer.

Example 36 includes the apparatus of any of Examples 32 to 35, further comprising means for determining an anticipated change in shape of the wafer to be held thereon after one or more process steps, and means for forming the surface with the non-flat shape to compensate for the determined anticipated change in shape.

Example 37 includes the apparatus of Example 36, wherein the anticipated change in shape corresponds to a resulting complex, irregular shape of the wafer.

Example 38 includes the apparatus of any of Examples 32 to 27, further comprising means for characterizing a wafer by a plurality of measured data points related to a shape of the wafer, means for determining variations to flatness of the characterized wafer based on the plurality of measured data points, and means for forming the surface with the non-flat shape to compensate for the determined variations to flatness of the characterized wafer.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C. Various components of the systems described herein may be implemented in software, firmware, and/or hardware and/or any combination thereof. For example, various components of the systems or devices discussed herein may be provided, at least in part, by hardware of a computing SoC such as may be found in a computing system such as, for example, a smart phone. Those skilled in the art may recognize that systems described herein may include additional components that have not been depicted in the corresponding figures. For example, the systems discussed herein may include additional components such as bit stream multiplexer or de-multiplexer modules and the like that have not been depicted in the interest of clarity.

While implementation of the example processes discussed herein may include the undertaking of all operations shown in the order illustrated, the present disclosure is not limited in this regard and, in various examples, implementation of the example processes herein may include only a subset of the operations shown, operations performed in a different order than illustrated, or additional operations.

In addition, any one or more of the operations discussed herein may be undertaken in response to instructions provided by one or more computer program products. Such program products may include signal bearing media providing instructions that, when executed by, for example, a processor, may provide the functionality described herein. The computer program products may be provided in any form of one or more machine-readable media. Thus, for example, a processor including one or more graphics processing unit(s) or processor core(s) may undertake one or more of the blocks of the example processes herein in response to program code and/or instructions or instruction sets conveyed to the processor by one or more machine-readable media. In general, a machine-readable medium may convey software in the form of program code and/or instructions or instruction sets that may cause any of the devices and/or systems described herein to implement at least portions of the operations discussed herein and/or any portions the devices, systems, or any module or component as discussed herein.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the embodiments are not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. An apparatus, comprising:
a chuck body; and
a surface formed on the chuck body, wherein the surface has a fixed non-flat shape and is configured to hold a wafer;
wherein the surface further includes a plurality of distinct portions distributed on the surface, and wherein each of the plurality of distinct portions has a respective fixed local variation with respect to a reference plane, and the respective fixed local variation corresponds to an anticipated stress of a wafer to be caused by a process of the apparatus at the respective distinct portion.

2. The apparatus of claim 1, wherein the fixed non-flat shape comprises a concave shape.

3. The apparatus of claim 1, wherein the fixed non-flat shape comprises a convex shape.

4. The apparatus of claim 1, wherein the fixed non-flat shape comprises a saddle shape.

5. The apparatus of claim 1, wherein the fixed non-flat shape of the surface is configured to compensate for an anticipated change in a shape of the wafer to be held thereon after one or more process steps.

6. The apparatus of claim 5, wherein the non-flat shape comprises a complex, irregular shape.

7. The apparatus of claim 1, further comprising:
a wafer fabrication apparatus to perform one or more process steps on the wafer, wherein the chuck body is coupled to the wafer fabrication apparatus to hold the wafer for the one or more process steps.

8. The apparatus of claim 1, wherein the plurality of distinct portions include at least 10 portions, and respective fixed local variations of the plurality of distinct portions of the surface of the chuck body are configured to compensate for an incoming wafer shape and the anticipated stress on different portions of the wafer.

9. The apparatus of claim 1, wherein the surface has a plurality of vacuum holes configured to hold the wafer closely in contact with the fixed non-flat shape of the surface during wafer processing and make the wafer be substantially flat when the wafer is released after wafer processing.

10. A method, comprising:
holding a wafer on a chuck; and
performing one or more process steps on the wafer while the wafer is held on the chuck, wherein a surface of the chuck that holds the wafer has a fixed non-flat shape;
wherein the surface of the chuck further includes a plurality of distinct portions distributed on the surface, and wherein each of the plurality of distinct portions has a respective fixed local variation with respect to a reference plane, and the respective fixed local variation corresponds to an anticipated stress of the wafer to be caused by the one or more process steps at the respective distinct portion.

11. The method of claim 10, wherein the fixed non-flat shape comprises a concave shape.

12. The method of claim 10, wherein the fixed non-flat shape comprises a convex shape.

13. The method of claim 10, wherein the fixed non-flat shape comprises a saddle shape.

14. The method of claim 10, wherein the fixed non-flat shape of the surface is configured to compensate for an anticipated change in shape of the wafer held thereto after the one or more process steps.

15. The method of claim 14, wherein the non-flat shape comprises a complex, irregular shape.

16. A method, comprising:
forming a chuck body;
characterizing a wafer by a plurality of measured data points related to a shape of the wafer, wherein the plurality of measured data points distributed on the shape of the wafer;
determining respective fixed local variations to flatness of the characterized wafer based on the plurality of measured data points; and
forming a surface with a fixed non-flat shape on the chuck body to compensate for the determined fixed local variations of the characterized wafer;
wherein the surface further includes a plurality of distinct portions distributed on the surface, and wherein each of the plurality of distinct portions corresponds to a respective fixed local variation corresponding to an anticipated stress of the wafer to be caused by a process of an apparatus at the respective distinct portion.

17. The method of claim 16, further comprising:
forming one of a concave shape, a convex, and a saddle shape on the chuck body for the surface to hold the wafer.

18. The method of claim 14, further comprising:

determining an anticipated change in the shape of the wafer to be held thereon after one or more process steps; and forming the surface with the fixed non-flat shape to compensate for the determined anticipated change in the shape.

19. The method of claim 18, wherein the anticipated change in shape corresponds to a resulting complex, irregular shape of the wafer.

* * * * *